United States Patent [19]
Lin et al.

[11] Patent Number: 5,838,708
[45] Date of Patent: *Nov. 17, 1998

[54] INTEGRATION OF SURFACE EMITTING LASER AND PHOTODIODE FOR MONITORING POWER OUTPUT OF SURFACE EMITTING LASER

[75] Inventors: Hong Lin, Palo Alto; Long Yang, Union City; Michael R. T. Tan, Menlo Park; Shih-Yuan Wang, Palo Alto, all of Calif.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 509,886

[22] Filed: Aug. 1, 1995

Related U.S. Application Data

[62] Division of Ser. No. 332,231, Oct. 31, 1994, Pat. No. 5,491,712.

[51] Int. Cl.⁶ ............................................. H01S 3/18
[52] U.S. Cl. .................................. 372/50; 372/96
[58] Field of Search ................... 372/50, 96, 45

[56] References Cited

U.S. PATENT DOCUMENTS

| | | | |
|---|---|---|---|
| 4,297,653 | 10/1981 | Seifres et al. | 331/94 |
| 5,136,603 | 8/1992 | Hasain et al. | 372/50 |
| 5,256,596 | 10/1993 | Ackley et al. | 372/45 |

FOREIGN PATENT DOCUMENTS

| | | |
|---|---|---|
| 2588701 | 4/1877 | France . |
| 58071676 | 7/1958 | Japan . |
| 59125659 | 11/1984 | Japan . |
| 62015872 | 1/1987 | Japan . |
| 63095690 | 4/1988 | Japan . |
| 05251828 | 9/1993 | Japan . |
| 6097597 | 4/1994 | Japan . |

OTHER PUBLICATIONS

Hecht, Understanding Lasers An Entry Level Guide, IEEE Press, pp. 280–281, 1994.

G. W. Turner et al., "Through–Wafer Optical Communication Using Monolithic InGaAs–on Si Led's and Monolithic PtSi8–Si Schottky–Barrier Detector" IEEE Photonics Technology Letters, vol. 3, No. 8, Aug. 1991, New York, pp. 761–763.

*Primary Examiner*—John D. Lee
*Assistant Examiner*—Yisun Song
*Attorney, Agent, or Firm*—Denise A. Lee

[57] ABSTRACT

The present invention provides a structure and method for integrating a photodiode and surface emitting laser on a substrate which minimizes both process complexity and exposure of epitaxial layers. In a first embodiment, a photodiode structure is integrated with the surface emitting laser simply by adding a separate Schottky contact to the surface of the SEL. In a second embodiment, a photodiode structure is integrated with the surface emitting laser by positioning a current isolation region between the photodiode and the SEL. The current isolation region should extend into a first mirror region but not into the light generation region of the active region so that the light generation region of the SEL is optically coupled to the light absorption region of the photodiode.

10 Claims, 5 Drawing Sheets

INTEGRATION OF SURFACE EMITTING LASER AND PHOTODIODE FOR MONITORING POWER OUTPUT OF SURFACE EMITTING LASER

CROSS REFERENCE TO RELATED APPLICATION

This is a divisional of application Ser. No. 08/332,231 filed on Oct. 31, 1994 now U.S. Pat. No. 5,491,712.

BACKGROUND OF THE INVENTION

The present invention relates generally to surface emitting lasers and more specifically to the integration of surface emitting lasers and a photodiode on a substrate.

Surface emitting lasers have many advantages over conventional edge emitting lasers including a simpler manufacturing process, a single longitudinal mode of operation, higher coupling efficiency and lower cost. In order to maintain constant power output of surface emitting lasers in an optical communication system, the output power of the SEL (surface emitting laser) must be monitored. As photodiodes are typically used to monitor the output power of a surface emitting laser, it is desirable to integrate the monitoring photodiode and SEL on a single substrate.

One solution for integration of a monitoring photodiode and a surface emitting laser is reported in the reference by G. Hasnian et al., "Monolithic Integration of Photodiode with Vertical Cavity Surface Emitting. Laser,", Electronics Letters (27) 18, p 1630, 1991, which describes a growth of a PIN diode on the p-type mirror region of a top-emitting surface emitting laser (SEL). FIG. 1 shows a PIN photodiode structure 100 grown on the p-type mirror region 102 of a top-emitting SEL 104. The PIN photodiode 100 is comprised of a p-type region 102, an i-type absorption region 106, and an n-type region 108. To operate the photodiode 100 as a power monitoring device, the photodiode 100 is reverse biased by applying a positive voltage to n-contact 110 while p-contact 112 is connected to ground. A negative bias is applied to n-contact 114 to forward bias the SEL 104. The absorption layer 106 absorbs a portion of the light output by the SEL 104. Knowing the amount of light absorbed by the absorption layer 110, the output power of the SEL 104 can be determined.

Although the photodiode 100 gives good performance, manufacturing complexity is increased by the steps of adding additional epitaxial layers necessary to form the i-type absorption region 106 and the n-type region 108 of the photodiode. Further, the additional epitaxial layers necessary for photodiode formation must be etched to the surface of the p-type mirror region to form a p-contact. The etch to the surface of the p-type mirror region of the SEL leaves the sidewalls of the i-type absorption layer 106 and the n-type region 108 of the photodiode exposed. The exposed epitaxial layers are subject to oxidation which decreases device reliability.

A second alternative solution for integration of a photodiode and a surface emitting laser is reported in the article "Detector-enclosed Vertical Cavity Surface Emitting Lasers", Electronics Letters (29)5 p.466, 1993 by K. D. Choquette et al., which describes a top emitting SEL where the photodiode is formed in a concentric ring around the SEL. The concentric ring photodiode is positioned around 40 microns away from the SEL. Light from the SEL is scattered in free space and is captured by the concentric absorption region. Similar to the embodiment shown in FIG. 1, the photodiode structure described in the article "Detector-enclosed Vertical Cavity Surface Emitting Lasers", exposes the sidewalls of epitaxial layers. Specifically, the process for photodiode formation includes an etch step which exposes the n-type and p-type mirror regions of the SEL resulting in oxidation of the sidewalls of the exposed regions.

A method of integrating a photodiode and surface emitting laser which minimizes process complexity and minimizes exposed epitaxial layers is needed.

SUMMARY OF THE INVENTION

The present invention provides a structure and method for integrating a photodiode and surface emitting laser on a substrate which minimizes both process complexity and exposure of epitaxial layers. In a first embodiment, a photodiode structure is integrated with the surface emitting laser simply by adding a separate Schottky contact to the surface of the SEL. In a second embodiment, a photodiode structure is integrated with the surface emitting laser by positioning a current isolation region between the photodiode and the SEL. The current isolation region typically extends into a first mirror region but not into the light generation region.

In the first embodiment, a photodiode structure is integrated with the surface emitting laser by adding a separate Schottky contact in the optical path of the surface of the SEL. As is well known, a surface emitting laser is comprised of a first mirror region, an active region, and a second mirror region typically constructed on a substrate. Assuming for purposes of example a bottom emitting surface emitting laser having a p-i-n diode structure where the first mirror region has a p-type conductivity, the second mirror region has a n-type conductivity and the substrate is n-type. The Schottky contact is located in the optical path of the light emitted from the SEL. Thus for the described example, the Schottky contact according to the present invention would be formed on the bottom surface of the n-type substrate.

In one embodiment, the Schottky contact is formed by applying a thin metal layer to the bottom surface of the substrate and forming a bonding pad contact on the surface of the thin metal layer. The metal used for the Schottky contact should be chosen so that the Schottky barrier formed between the metal and the semiconductor material is less than the photon energy of the light to be emitted. The thickness of the metal should be chosen so that emitted light is partially transparent to the emitted light. The thin metal layer is then patterned to leave metal remaining in the desired regions. At least a portion of the thin metal layer should be in the path of the emitted light from the SEL.

Next, a masking pattern is formed on the surface of the Schottky contact and the substrate. After formation of the masking pattern, a second conductive layer is formed. When the masking pattern is removed, the second conductive layer should be formed on the surface of the thin metal layer and on the surf ace of the substrate. The second conductive layer formed on the thin metal layer forms a bonding pad which is coupled to a current measuring device. The second conductive layer formed on the surface of the substrate forms the ohmic n contact to the SEL.

To operate as a monitoring device, the SEL is forward biased and the Schottky diode is reverse biased. In the described example of a bottom emitting SEL having a p-i-n diode structure, the p contact is formed on the surface of the first mirror region is electrically coupled to a positive voltage, a negative voltage is coupled to the Schottky contact, and the ohmic n contact is coupled to ground. Forward biasing the SEL results in light generation which is detected by the Schottky diode. The detected light is proportional to the output power.

The advantage of using a Schottky photodiode structure, is that the Schottky detector can be integrated into the SEL structure with minimal increase in process complexity. The only steps in addition to those steps required for SEL formation are depositing a thin metal film in the optical path of the output light and forming a bonding pad contact to the thin metal film. Further, the Schottky photodiode detector provides direct detection of the output power of the SEL and thus is believed to be linearly proportional to the output power. Further, the Schottky detector disclosed in the present invention provides easy bonding access, since the Schottky photodiode is located on the output facet of the surface emitting laser. This same embodiment can be implemented in a top-emitting SEL, with or without reversing the n-type and p-type mirror regions.

In a second embodiment, a photodiode structure is integrated with the surface emitting laser by positioning a current isolation region between the photodiode and the SEL. The current isolation region should electrically isolate the SEL and the photodiode. Typically the current isolation region extends into a first mirror region about 5 um above the active layer. The light generation region of the SEL is optically coupled to the light absorption region of the photodiode. Since the light generation region of the SEL is optically coupled to the light generation region of the adjacent photodiode structure, a portion of the light emitted from the light generation region is detected by the photodiode.

The side absorption photodiode structure can be integrated with the SEL structure with minimal increase in process complexity. A further advantage of the side absorption photodiode structure is that it provides a planar structure and does not require additional epitaxial layers for construction of the photodiode structure. Further, because all the steps for formation of the SEL and photodiode occur simultaneously, no extra processing steps above those necessary to make the SEL are required to fabricate the side photodiode. In addition, because the Bragg mirrors act as a light guide, the side absorption photodiode need not be concentric to the SEL to be efficient.

A further understanding of the nature and advantages of the present invention may be realized with reference to the remaining portions of the specification and the attached drawings.

DETAILED DESCRIPTION OF THE PREFERRED EMBODIMENTS

Figures 1, 2:
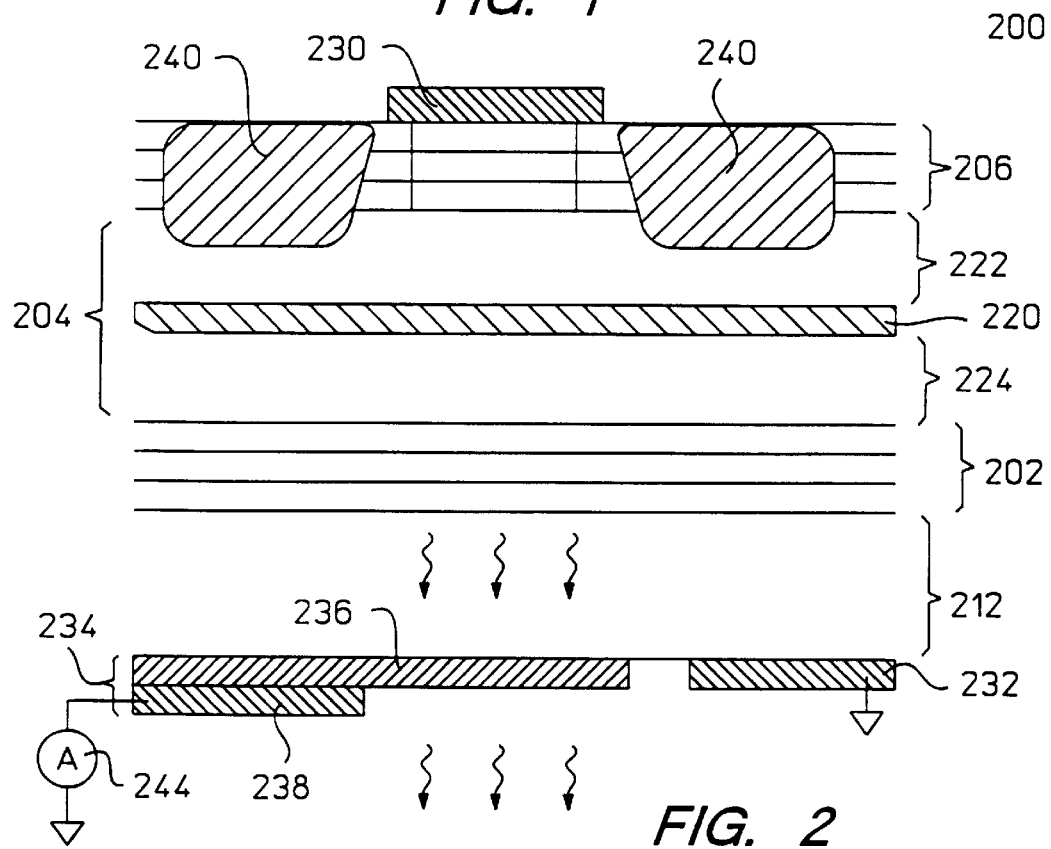
FIG. 1 shows a PIN photodiode structure grown on the surface of a mirror region of a top-emitting SEL.
FIG. 2 shows a Schottky photodiode structure integrated with a bottom-emitting SEL according to the present invention.

Referring to FIG. 2 shows a Schottky photodiode structure integrated with a bottom-emitting SEL according to the present invention. Since the construction of SELs is well known to those skilled in the art, SEL construction will not be described in detail here. For the purposes of this discussion, it is sufficient to note that the SEL 200 may be viewed as a p-i-n diode having a first mirror region 202, an active region 204, and a second mirror region 206 constructed on a substrate 212. The first and second mirror regions 202, 206 and the active region 204 are typically constructed of thin semiconductor layers formed by molecular beam epitaxy.

The mirror regions 202, 206 are constructed from alternating layers having different indices of refraction. The thickness of each layer is chosen to be one quarter of the wavelength of emitted light. Stacks of these alternating layers form Bragg mirrors. The stacks are typically constructed from alternating layers of AlAs and GaAs. To obtain the desired reflectivity 15 to 20 pairs of alternating layers are typically required. In the embodiment shown in FIG. 2, the layers in the second mirror region 206 are typically doped to be p-type semiconductors and those in the first mirror region 202 are doped to be n-type semiconductors. The substrate 212 is preferably an n-type semiconductor.

The active region 204 is comprised of a light generation region 220, and cladding regions 222, 224. The light generation region 220 is typically constructed from one or more quantum wells of InGaAs which are separated from the first and second mirror regions 202, 206 by cladding regions 222, 224. The light generation region 220 may be viewed as a light generation layer which generates light due to spontaneous and stimulated emission via the recombination of electrons and holes generated by forward biasing the p-i-n diode.

For the example of a bottom emitting SEL having a p-i-n diode structure, the electrode 230 formed on the surface of the second mirror region 206 is a p-type ohmic contact. The electrode 232 formed on the bottom surface of the substrate 212 is an n-type ohmic contact. The electrode 234 is comprised of a Schottky contact 236 comprised of a thin metal layer and a bonding pad 238. To form a Schottky contact 236, the metal comprising the Schottky contact and the substrate material should be chosen so that the Schottky barrier is lower than the photon energy. This creates a Schottky barrier which minimizes electron tunneling and provides a rectifying contact.

In the embodiment, shown in FIG. 2 the SEL is a p-i-n bottom emitting SEL. Alternatively, the SEL be a n-i-p type SEL. Alternatively, the alternative Schottky contact structure may be constructed on the top surface of second mirror region of the SEL. The light generation region generates light which is emitted through a first surface in the first direction. For the example shown in FIG. 2, the first surface is the bottom surface of the substrate. Alternatively, in a top emitting SEL, the first surface is the top surface of the second mirror region.

Typically the substrate 212 is comprised of GaAs having a n-type dopant concentration greater than $1 \times 10^{18}$ atoms/cm$^3$ and the metal is comprised of a material such as gold. Other materials than GaAs or gold may be used, and dopant concentrations may vary. The important thing is to choose the metal and substrate materials used for forming the Schottky contact so that the Schottky barrier is lower than the photon energy. Preferably, the dopant concentration of the semiconductor material of the substrate should be low so that Schottky barrier is lower than the photon energy.

In the preferred embodiment, the thin metal layer 236 has a thickness of in the range of approximately 1 nm to 500 nm and the bonding pad 238 has a thickness of approximately 0.5 um. The thin metal film 236 makes a Schottky contact to the substrate 212. Although it is not necessary to make the metal 236 thin to form a Schottky contact, in the embodiment shown in FIG. 2 the Schottky contact must be thin to allow transmission of the emitted light through the metal layer. The thickness of the metal should be chosen so that emitted light is it is partially transparent to the emitted light. If the thickness of the Schottky metal layer is too thick, the emitted light is totally absorbed by the Schottky metal layer and no light is emitted by the SEL. If no Schottky metal layer is formed partially or over all of the optical path of the emitted light, the SEL laser functions but no photocurrent is detected. In the embodiment shown in FIG. 2, the metal layer provides partial absorption resulting in emitted light from the SEL and the production of photocurrent in the photodiode structure. Alternatively, a thick metal may be used in forming the Schottky contact if the photodiode structure only partially intercepts the light. For example, the Schottky contact shown in FIG. 3A only partially intercepts the emitted light.

In the embodiment shown in FIG. 2, the bandgap of the substrate 212 can be greater than the photon energy so that the substrate 212 does not absorb the emitted light. This is in contrast to the embodiment shown in FIG. 1, where the bandgap of the absorbing layer 106 is less than the photon energy.

The SEL output facet is comprised of a semiconductor material that has a band gap energy larger than the output photon energy. Therefore, the top semiconductor material is no-t absorbing the light in a band-to-band transition. Thus, the thin metal layer 230 absorbs light and the Schottky barrier detects the photo-current. An anti-reflection coating may be applied to the surface of the metal film 236 to reduce reflectivity.

It should be noted that the SEL 200 is not shown to scale. In particular, the mirror regions 202, 206 and the lights generation region 204 have been expanded to provide clarity in the drawing. In practice, the thickness of the substrate 212 is typically 150 um compared to about 10 um for the total thickness of the mirror regions 202, 206 and the light generation region 204. The ohmic contacts 230, 232 have a thickness of approximately 0.5 um and a width of approximately 5–100 um.

A positive voltage is applied to p-contact 230 and contact 232 is connected to ground, resulting in forward biasing of the SEL and reverse biasing of the Schottky diode. Forward biasing the SEL 200 results in current flows between contacts 230 and 232. In the preferred embodiment, the current flow between contacts 230 and 232 is confined by implanting regions 240 to convert them into regions of high resistivity. This is typically accomplished by implanting regions 242 and 244 with hydrogen ions.

Forward biasing the SEL and reverse biasing the Schottky diode results in a photocurrent in the Schottky diode. When light passes through the thin metal layer 236, a portion of the emitted light is absorbed by the metal layer 236. The absorbed light causes a photocurrent in the Schottky diode. The photo-current is proportional to the output power of the emitted light.

The steps required for formation of the SEL are: forming a first mirror region on a substrate, forming an active region, and forming a second mirror region. The advantage of using a Schottky photodiode structure, is that the Schottky detector can be integrated into the SEL structure with minimal increase in process complexity. The only steps in addition to those steps required for SEL formation are: depositing a thin metal film in the optical path of the output light and forming a bonding pad contact to the thin metal film. Thus, the Schottky contact is formed by applying a thin metal layer to the bottom surface of the substrate and forming a bonding pad contact on the surface of the thin metal layer.

Before formation of the Schottky contact, the substrate may be etched to provide a clean surface for superior contact formation. After cleaning the surface of the substrate 212, a first conductive layer 236 is formed on the surface of the substrate 212. In the present invention, the first conductive layer 236 is metal, typically gold. The metal layer 236 is then patterned to leave metal remaining in the desired regions. At least a portion of the metal layer 236 should be in the path of the emitted light from the SEL.

Next, a masking pattern is formed on the surface of the Schottky contact 236 and the substrate 212. After formation of the masking pattern, a second conductive layer 238 is formed. When the masking pattern is removed, a portion of the originally deposited layer 238 remains on the surface of the metal layer 236 to form a bonding pad 238 coupled to a current measuring device 244. In a first preferred method, the removal of the masking pattern also leaves a portion of the deposited layer 238 on the substrate surface. The portion of layer 238 formed on the substrate surface is the n-type ohmic contact 232. Thus in the preferred embodiment, the n-type ohmic contact 232 and the bonding pad 238 are formed simultaneously.

The order of formation of the n-type contact in relation to the formation of the Schottky contact is not critical. Further, an annealing step may follow formation of the n-type ohmic: contact 232. For example, in a second alternative method, the p-type ohmic contact 230 and the n-type ohmic contact 232 are formed before formation of the Schottky contact 236. After formation of the p-type contact 230 and the n-type ohmic contact 232 an annealing step occurs. The annealing step provides an improved ohmic contact by alloying the ohmic metal providing a high dopant concentration at the surface. In the second method, the Schottky contact 236 and bonding pad are formed after the annealing step. Alternatively, if the metal used for the Schottky contact has a low diffusion constant and the annealing step takes place at a temperature which results in negligible diffusion of the metal 236 into the substrate 212, the annealing step may take place after the formation of the Schottky contact 236.

Figure 3A:
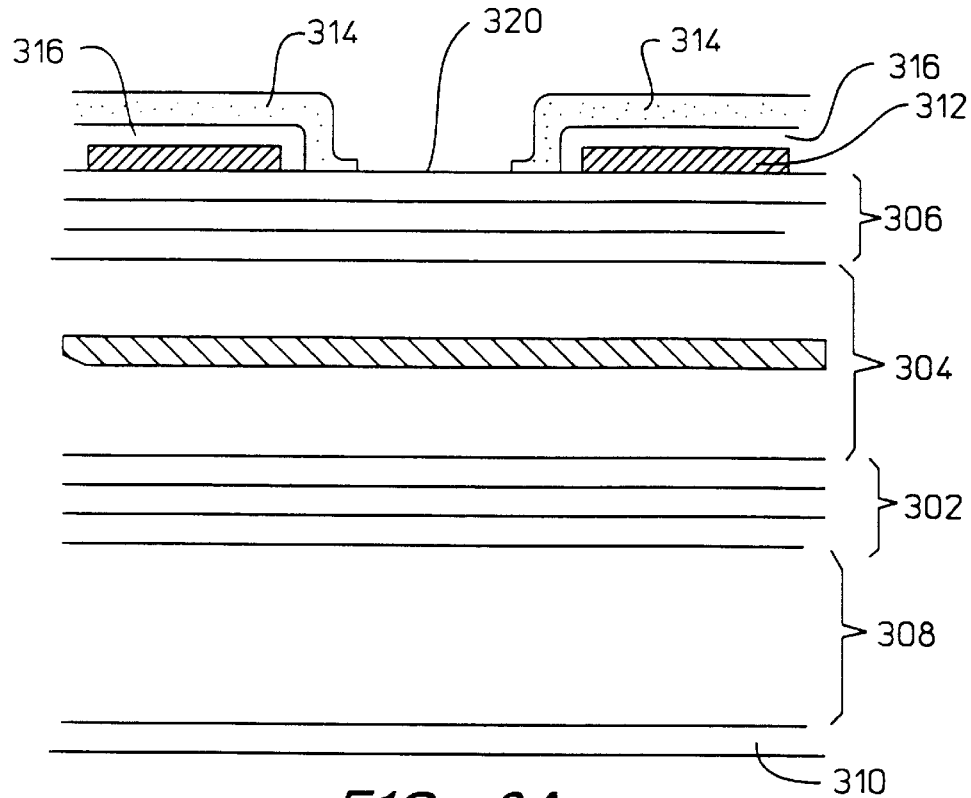
FIGS. 3A–3D show alternative contact structures for a Schottky photodiode structure integrated with a top-emitting SEL according to the present invention.

FIGS. 3A–3D show alternative contact structures for a Schottky photodiode structure. In the alternative structures shown in FIG. 3, a dielectric material separates the ohmic contact to the SEL and the Schottky contact to the photodiode. FIG. 3A shows a Schottky photodiode integrated with a top-emitting SEL. The top emitting SEL 300 is comprised of a first mirror region 302, an active region 304, and a second mirror region 306 constructed on a substrate 308.

In the embodiment, shown in FIGS. 3A–3D, the laser is a p-i-n diode top emitting SEL such that the first mirror region 302 is n-type and the second mirror region 306 is p-type. Alternatively, the lasers shown in FIG. 3A–D may be a n-i-p diode where the first mirror region 302 is p-type and the second mirror region 306 is n-type. Alternatively, the alternative contact structure shown in FIG. 3 may be constructed for a bottom emitting laser.

The structure shown in FIG. 3A includes a n-type ohmic contact 310 formed on the surface of the substrate 308. A p-type ohmic contact 312 and a Schottky contact 314 are formed above the surface of the second mirror region 306. The n-type and p-type ohmic contacts 310, 312 are typically formed of AuGe and AuZn respectively and have a thickness of approximately 0.5 um. The Schottky contact structure is separated from the p-type ohmic contact by a dielectric layer 316, typically polyimide. The. Schottky contact 314 is typically comprised of such materials as Au, Pt, Al and has a thickness in the range of 1 nm to 500 nm. Alternatively, the metal layer used for Schottky contact formation 314 may extend across the entire SEL window 320. In this alternative embodiment, the thickness of the metal layer should be a thin metal film having a thickness in the range of that provided for in embodiment shown in FIG. 2.

After formation of the first mirror region 302, the active region 304, and the second mirror region 306, the ohmic contact 312 and the Schottky contact 314 are formed. In the embodiment shown in FIG. 3A, the process formation is typically as follows. First, a conductive layer 312 is formed on the surface of the second mirror region. The conductive layer 312 is patterned according to well known lithographic techniques and portions of the conductive layer are removed to leave ohmic contacts 312. After the formation of ohmic contacts 312, a dielectric layer 316 is deposited and patterned. Portions of the dielectric layer extending over the SEL window are removed. Next, a second conductive layer 314 is deposited. In a first embodiment, portions of the second layer 314 over the SEL window are patterned and removed. In a second embodiment, the portions of the second layer over the SEL window 320 are not removed.

Figure 3B:
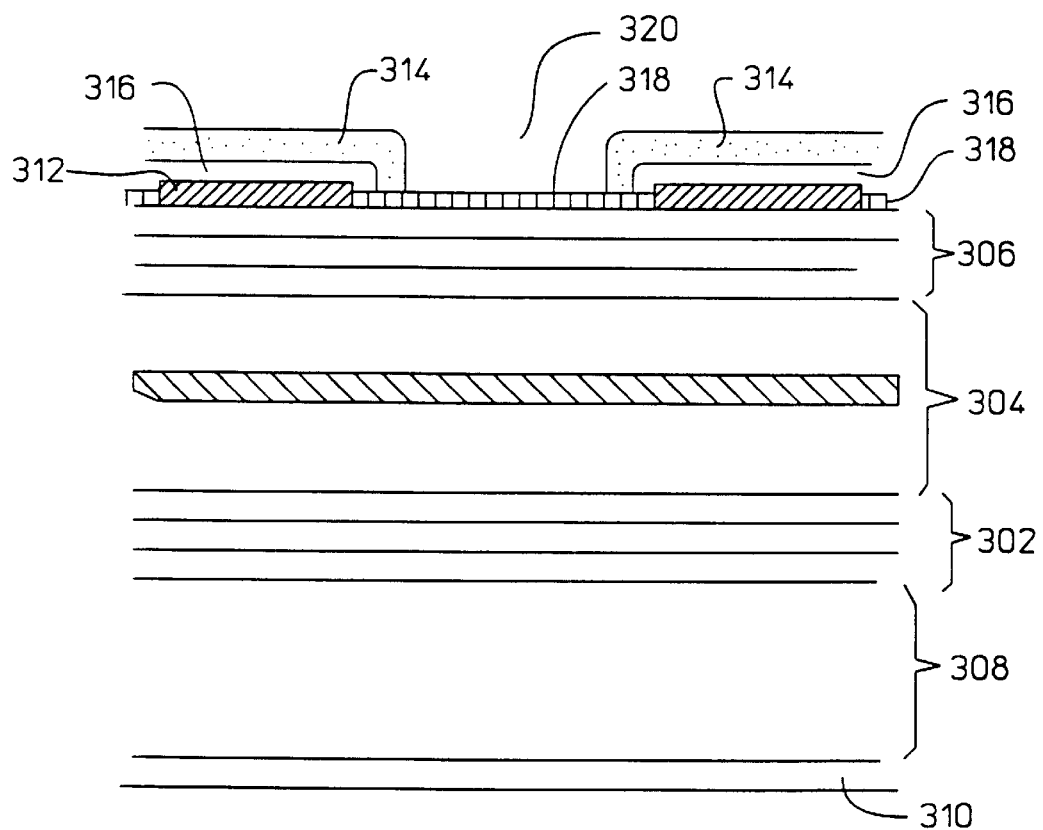

The embodiment shown in FIG. 3B shows an alternative contact structure embodiment for a Schottky photodiode. The embodiment shown in FIG. 3B is similar to the embodiment shown in FIG. 3A. However, unlike the embodiment shown in FIG. 3A, the structure shown in FIG. 3B includes an absorption layer 318. The absorption layer 318 is typically InGaAS. In the embodiment shown in FIG. 3B, the n-type ohmic contact 312 extends through the absorption layer 318 to contact with the first mirror region 302. The Schottky contact 314 makes contact with the InGaAs absorption layer 318. Contact 314 can also be an ohmic contact. For example, the absorption layer can be amorphous semiconductor material, for example Ge.

Figure 3C:
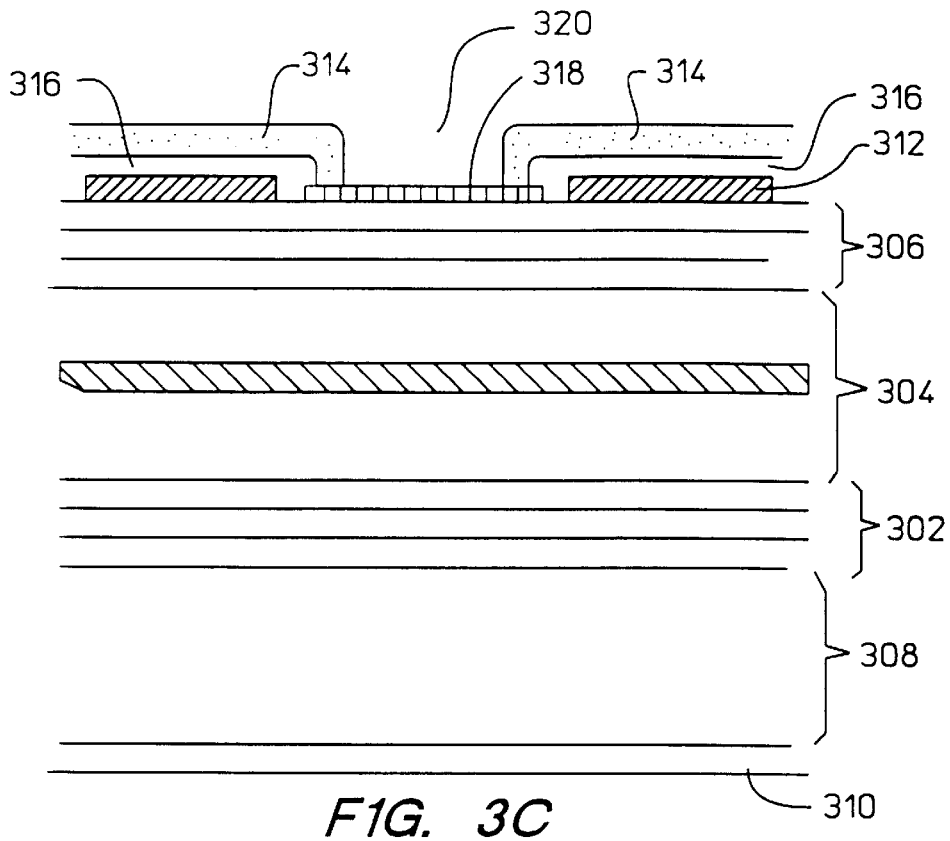
Figure 3D:
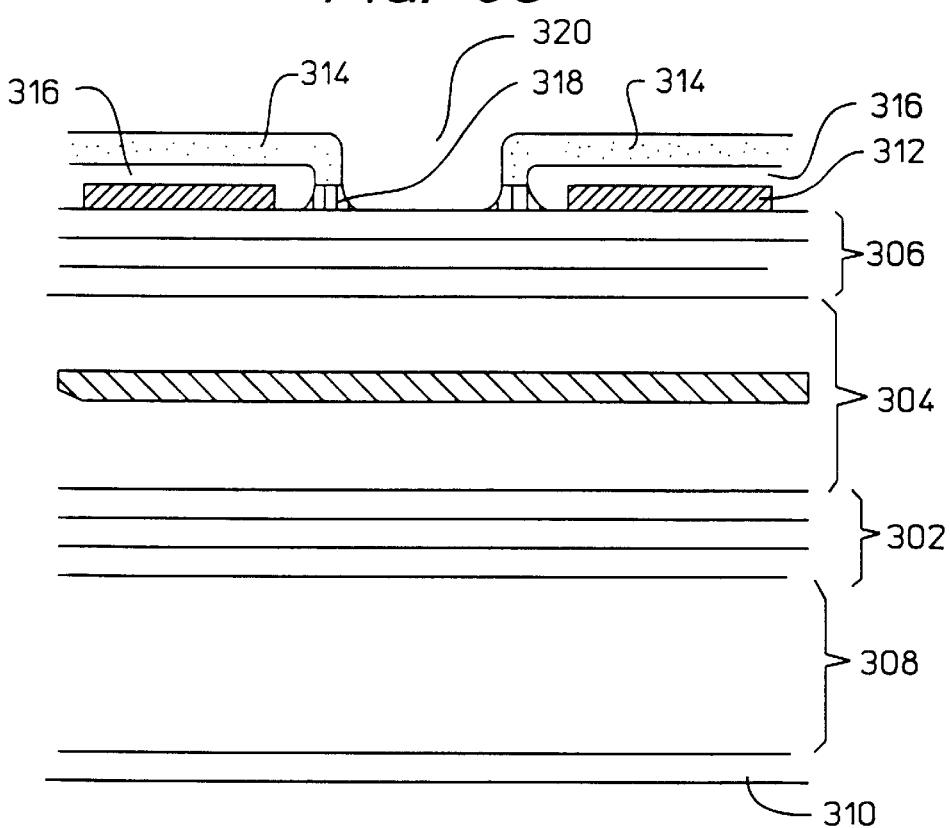

The embodiment shown in FIG. 3B–3D include the step of formation of an absorption region. Typically, the embodiment shown in FIG. 3B is formed according to the following process. After formation of the second mirror region 306, the absorption layer 318 is formed. After formation of the absorption layer 318 on the surface of the second mirror region 306, a portion of the absorption layer 318 is removed in the region where the ohmic contact 312 is to be formed. Next, the ohmic contact 312 is formed. The ohmic contact is typically formed by depositing a first conductive layer 312 and by using techniques well known in the art, removing the first conductive layer 312 except in regions where the ohmic contact is to be formed. After formation of the ohmic contact, a dielectric layer 316 is deposited. The dielectric layer 316 should cover the ohmic contact to prevent shorting between the conductive ohmic contact and the Schottky metal layer which is later deposited. After formation of the dielectric layer 316, a portion of the dielectric layer over the absorption layer is removed. Next, a conductive second layer 314 is formed to provide a Schottky contact to the absorption layer. A portion of the second conductive layer is typically removed so that light may be emitted through the window. The absorption layer only needs to intercept the light partially.

The embodiment shown in FIG. 3C is similar to the embodiment shown in FIG. 3B, however, in the embodiment shown in FIG. 3B the absorption layer only extends past the Schottky contact and does not extend past the ohmic contact. The process for formation of the embodiment shown in FIG. 3C is similar to the process described in FIG. 3B, except that the portion of the absorption layer in the region where the p contact is to be formed is removed prior to the deposition of the metal layer 312.

A fourth alternative Schottky contact structure is shown in FIG. 3D. The embodiment shown in FIG. 3D is similar to the embodiment shown in FIG. 3C, with the exception that the absorption layer does not extend across the entire window of the laser opening. Thus the process of formation of the embodiment shown in FIG. 3D is similar to that shown in FIG. 3C, except that portions of the absorption layer 318 in the window of the SEL are removed.

Figure 4A:
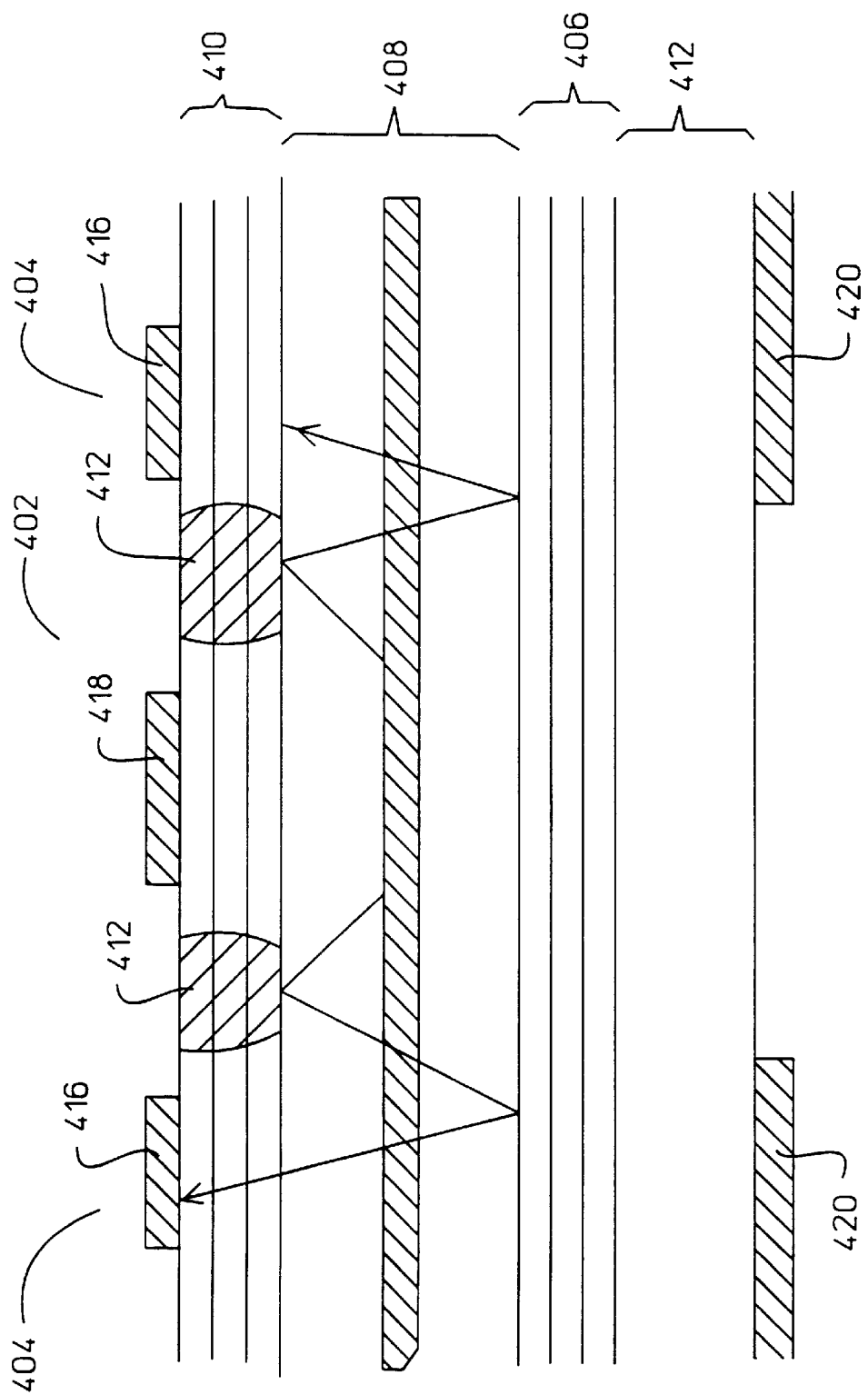
FIGS. 4A and 4B show side adsorption photodiode structures according to the present invention.

Referring to FIG. 4A shows a side absorption photodiode structure integrated with a surface emitting laser according to a first alternative embodiment of the present invention. FIG. 4A shows a first embodiment where a side photodiode 402 is formed in the region adjacent to the surface emitting laser 404. Similar to previously described SELs, the SEL 404 includes a first mirror region 406, an active region 408, and a second mirror region 410 constructed on a substrate 412. However, unlike previously described SELs, the described structure includes current isolation regions positioned between the SEL 404 and the photodiode 402.

The current isolation regions 412 are positioned between the surface emitting laser 404 and the photodiode 402. Typically the current isolation region 412 extends downwardly from the surface of the second mirror region, ending before the light generation region 408. The current isolation regions 412 are regions of high resistivity formed typically by implanting regions 412 with hydrogen ions. Preferably, the current isolation region 412 ends about 5 um above the active region 408 in order to decrease contamination of the light generation region 408 with hydrogen ions.

Voltage supply or ground interconnections are made to contacts 416, 418,420 such that the photodiode 402 is reverse biased and the SEL 404 is forward biased. Forward biasing the SEL 404 and reverse biasing the photodiode 402 allows light from the SEL 404 to be coupled to the reverse biased region of the photodiode 402. Reverse biasing the photodiode 402 causes a portion of the spontaneous and stimulated emission from the active region 408 of the SEL to be guided into the reverse bias section of the photodiode. The Bragg mirrors of the photodiode act as a light guide resulting in an efficient photodiode. The amount of spontaneous and stimulated emission sensed by the photodiode is proportional to the light output of the surface emitting laser.

The process of forming the photodiode 404 structure shown in FIG. 4 occurs simultaneously with the process of forming the SEL 404. For example, the photodiode contact structures 416 are formed simultaneously with the SEL contact structures 418. The advantage of the described side absorption photodiode structure is that it provides a planar structure requiring no additional epitaxial layers for construction of the photodiode structure. Further, because all the steps for formation of the SEL and photodiode occur simultaneously, no extra processing steps above those necessary to make the SEL are required to fabricate the photodiode. Because the Bragg mirrors act as a light guide, the area of the photodiode need not be concentric to the SEL to be efficient.

Figure 4B:
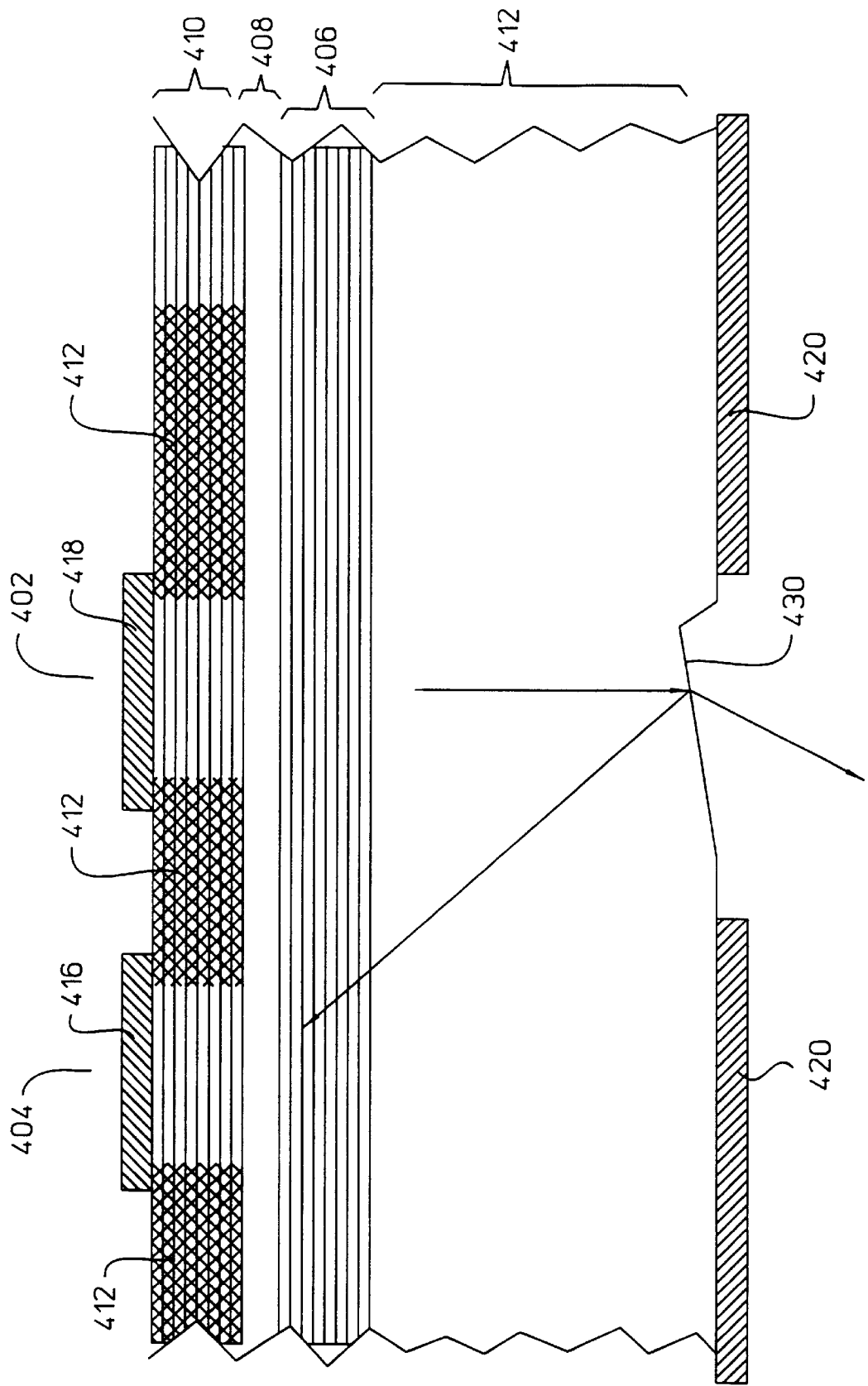

FIG. 4B shows an alternative preferred embodiment similar to that shown in FIG. 4A, with the exception that a deflector angle 430 is formed in the substrate 412 between the contacts 420. The deflector angle 430 allows detection of the lasing light directly, instead of by spontaneous emission. The deflector angle is made on the substrate surface using techniques well known in the art. The detector area can be made large so that the precision of the deflector angle is not critical. An additional advantage of the embodiment shown in FIG. 4B is that reflection back of the laser is completeLy eliminated by the angle deflector. It is well known that back reflection to the laser is considered detrimental for system applications.

It is understood that the above description is intended to be illustrative and not restrictive. By way of example, the photodiode monitoring devices may be used to monitor light output of any light emitting device, not merely a surface emitting laser. The light emitting devices may have a p-i-n or n-i-p structure and may be top-emitting or bottom emitting. The scope of the invention should therefore not be determined with reference to the above description, but instead should be determined with reference to the appended claims, along with the full scope of the equivalents to which such claims are entitled.

What is claimed is:

1. An integrated light emitting device and photodetecting device comprising:

an active region including a light generation region for generating light in response to light passing therethrough, the active region having a first side and a second opposite side, the light generation region emitting light in a first direction through a first surface;

a single contiguous second mirror region layer having a first side and a second opposite side, the single contiguous second mirror region layer for reflecting light towards the light generation region, the first side of the single continuous second mirror region layer being located on the first side of the active region, at least one current isolation region extending downwardly from the surface of the second side of the single contiguous second mirror region layer, the current isolation region separating the single contiguous second mirror region layer into at least a first photodetector mirror region, the current isolation region, and a first light emitting mirror region, wherein the first photodetector mirror region, the current isolation region, and the first light emitting mirror region are all formed within the single contiguous second mirror region layer;

a first mirror region having a first side and a second opposite side, the first mirror region for reflecting light towards the light generation region, the first side of the first mirror region being located on the second side of the active region;

a substrate having a first and second opposite side, the first side of the substrate region being located on the second side of the first mirror region;

a first contact on the surface of the first photodetector mirror region, wherein the first contact is biased to reverse bias the first photodetector mirror region; and a second contact on the surface of the first light emitting mirror region, wherein the second contact is biased to forward bias the first light emitting mirror region, wherein the active region, single contiguous second mirror region layer and first mirror region act as a waveguide for improving the optical collecting efficiency of the photodetecting device by guiding light to the first mirror region of the photodetecting device.

2. The integrated light, emitting device and photodetecting device recited in claim 1 wherein the at least one current isolation region ends before the light generation region.

3. An integrated light emitting device and photodetecting device comprising:

an active region including a light generation region for generating light in response to light passing therethrough, the active region having a first side and a second opposite side, the light generation region emitting light in a first direction through a first surface;

a second mirror region having a first side and a second opposite side, the second mirror region for reflecting light towards the light generation region, the first side of the second mirror region being located on the first side of the active region, at least one current isolation region extending downwardly from the surface of the second side of the second mirror region, the current isolation region dividing the second mirror region into a first photodetector mirror region and a first light emitting mirror region;

a first mirror region having a first side and a second opposite side, the first mirror region for reflecting light towards the light generation region, the first side of the first mirror region being located on the second side of the active region;

a substrate having a first and second opposite side, the first side of the substrate region being located on the second side of the first mirror region;

a first contact on the surface of the first photodetector mirror region, wherein the first contact is biased to reverse bias the first photodetector mirror region;

a second contact on the surface of the first light emitting mirror region, wherein the second contact is biased to forward bias the first light emitting mirror region; and wherein an angle deflector is formed on the second side of the substrate.

4. A method of forming an integrated light emitting device and photodetecting device comprising the steps of:

forming a first mirror region on a substrate, the first mirror region having a first and second opposite side, the first mirror region for reflecting light towards a light generation region;

forming an active region, the active region including the light generation region for generating light in response to light passing therethrough, the light generation region emitting light in a first direction through a first surface, the active region having a first side and a second opposite side, wherein the active region is formed on the first side of the first mirror region;

forming a single contiguous second mirror region layer, having a first side and a second opposite side, the single contiguous second mirror region layer for reflecting light towards the light generation region, the single contiguous second mirror region layer being formed on the first side of the active region;

forming at least one current isolation region extending downwardly from the surface of the second side of the single contiguous second mirror region layer, the current isolation region separating the second mirror region into at least a first photodetector mirror region, the at least one current isolation region, and a first light emitting mirror region, wherein the first photodetector mirror region, the at least one current isolation region, and the first light emitting mirror region are all formed within the single contiguous second mirror region layer;

forming a first contact on the surface of the first photodetector mirror region;

forming a second contact on the surface of the first light emitting mirror region;

biasing the first contact to reverse bias the first photodetector mirror region; and biasing the second contact to forward bias the first light emitting mirror region, wherein responsive to biasing the first contact and the second contact, the active region, the single contiguous second mirror region layer and the first mirror region act as a waveguide for improving the optical collecting efficiency of the photodetecting device by guiding light to the photodetecting device.

5. A method of forming an integrated light emitting device and photodetecting device comprising the steps of:

forming a first mirror region on a substrate, the first mirror region having a first and second opposite side, the first mirror region for reflecting light towards a light generation region;

forming an active region, the active region including the light generation region for generating light in response to light passing therethrough, the light generation region emitting light in a first direction through a first surface, the active region having a first side and a second opposite side, wherein the active region is formed on the first side of the first mirror region;

forming a second mirror region, having a first side and a second opposite side, the second mirror region for reflecting light towards the light generation region, the second mirror region being formed on the first side of the active region;

forming at least one current isolation region extending downwardly from the surface of the second side of the second mirror region, the current isolation region dividing the second mirror region into a first photodetector mirror region and a first light emitting mirror region;

forming a first contact on the surface of the first photodetector mirror region;

forming a second contact on the surface of the first light emitting mirror region;

biasing the first contact to reverse bias the first photodetector mirror region;

biasing the second contact to forward bias the first light emitting mirror region; and forming an angle deflector on the second side of the substrate.

6. The integrated light emitting device and photodetecting device recited in claim 1 wherein the active region, second mirror region and first mirror region act as a waveguide for guiding light to the photodetecting device.

7. The integrated light emitting device and photodetecting device recited in claim 1 wherein the current isolation region does not provide optical isolation.

8. The integrated light emitting device and photodetecting device recited in claim 1 wherein the second side of the single contiguous second mirror region layer is generally parallel to the first side of the active region.

9. The method recited in claim 4 wherein the current isolation region does not provide optical isolation.

10. The method recited in claim 4 wherein the second side of the single contiguous second mirror region layer is generally parallel to the first side of the active region.

* * * * *